(12) United States Patent
Lopez

(10) Patent No.: US 7,838,417 B2
(45) Date of Patent: Nov. 23, 2010

(54) SEMICONDUCTOR PACKAGE WITH A CHIP ON A SUPPORT PLATE

(75) Inventor: Jerome Lopez, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/512,461

(22) Filed: Jul. 30, 2009

(65) Prior Publication Data
US 2009/0288805 A1 Nov. 26, 2009

Related U.S. Application Data

(62) Division of application No. 10/961,466, filed on Oct. 8, 2004, now Pat. No. 7,573,141.

(30) Foreign Application Priority Data
Oct. 21, 2003 (FR) .................................. 03 12307

(51) Int. Cl.
*H01L 21/4763* (2006.01)
(52) U.S. Cl. ..................................................... 438/640
(58) Field of Classification Search ................. 438/613, 438/640
See application file for complete search history.

(56) References Cited

U.S. PATENT DOCUMENTS

| | | | |
|---|---|---|---|
| 5,285,352 A | 2/1994 | Pastore et al. | |
| 5,409,863 A | 4/1995 | Newman | |
| 5,583,377 A | 12/1996 | Higgins, III | |
| 5,592,025 A | 1/1997 | Clark et al. | |
| 5,741,729 A | 4/1998 | Selna | |
| 6,191,477 B1 | 2/2001 | Hashemi | |
| 6,282,094 B1 | 8/2001 | Lo et al. | |
| 6,521,990 B2 | 2/2003 | Roh et al. | |
| 6,605,353 B2 | 8/2003 | Okada et al. | |
| 6,861,750 B2 | 3/2005 | Zhao et al. | |
| 7,422,978 B2 * | 9/2008 | Lee .............................. | 438/629 |
| 2002/0185722 A1 | 12/2002 | Zhao et al. | |

OTHER PUBLICATIONS

Preliminary French Search Report, FR 0312307, dated May 25, 2004.

* cited by examiner

*Primary Examiner*—David A Zarneke
*Assistant Examiner*—Jenny L Wagner
(74) *Attorney, Agent, or Firm*—Gardere Wynne Sewell LLP

(57) ABSTRACT

A semiconductor package includes a support plate made of an electrically non-conducting material. Electrical connection vias are formed outside a chip fixing region provided on the front face of the support plate. Electrical connection wires connect pads on a front of the chip to pads on the front of the support plate associated with the electrical connection vias. The front face of the support plate is further provided with at least one intermediate front layer made of a thermally conducting material extending at least partly below the chip. The rear face of the support plate is provided with at least one rear layer made of a thermally conducting material extending at least partly opposite the front layer. The front and rear layers are connected by vias made of a thermally conducting material that fills through-holes made through the plate.

17 Claims, 2 Drawing Sheets

SEMICONDUCTOR PACKAGE WITH A CHIP ON A SUPPORT PLATE

PRIORITY CLAIM

The present application is a divisional of U.S. application for patent Ser. No. 10/961,466 filed Oct. 8, 2004 which claims priority from French Application for Patent No. 03 12307 filed Oct. 21, 2003, the disclosures of which are hereby incorporated by reference.

BACKGROUND OF THE INVENTION

1. Technical Field of the Invention

The present invention relates to the general field of semiconductor packages.

2. Description of Related Art

Known at the present time are semiconductor packages that comprise a support plate made of an electrically non-conducting material, a chip fixed by adhesive bonding at one point on a face of this support plate, electrical connection wires that connect pads on the chip to electrical connection vias that pass through the support plate, an encapsulation block of parallelepipedal shape that encapsulates the chip and the electrical wires, and electrical connection balls that are fixed to the vias on the opposite side of the chip.

Such packages have the drawback of confining the chips in materials that are very poor thermal conductors so that, if the chips generate heat, this heat is not easy to dissipate and impairs the electronic operation of the packages.

A need exists in the art for a semiconductor package whose structure allows the heat generated by the chip to be better dissipated.

SUMMARY OF THE INVENTION

In an embodiment, a semiconductor package comprises a support plate made of an electrically non-conducting material and provided with electrical connection through-means formed outside a fixing region provided on its front face, an integrated-circuit chip fixed to this fixing region, and electrical connection wires connecting pads on the front of the chip to pads on the front of the electrical connection means.

The front face of the plate is provided with at least one intermediate front layer made of a thermally conducting material extending at least partly below the chip, the rear face of the plate is provided with at least one rear layer made of a thermally conducting material extending at least partly opposite the front layer and in the front and rear layers are connected by vias made of a thermally conducting material that fills through-holes made through the plate.

The package preferably includes balls made of a thermally conducting material fixed to the rear layer.

The front layer preferably extends beyond the periphery of the chip and carries a projecting ring which surrounds the periphery of the chip at a certain distance therefrom and which stops the flow of an adhesive for fixing the latter.

The front and rear layers are preferably made of an electrically conducting material, at least one front pad on the front layer being connected to at least one pad on the front of the chip by at least one electrical connection wire.

The ring preferably extends between the periphery of the chip and the front pad on the front face.

The electrical connection means preferably comprise vias made of an electrically conducting material filling through-holes made through the plate.

In an embodiment, a method comprises: depositing a first layer of thermally conductive metal on a first surface of a support plate made of an electrically non-conducting material; depositing a second layer of thermally conductive metal on a second surface of the support plate opposite the first surface; forming at least one hole in the first layer of thermally conductive material, the hole extending through support plate and terminating at the second layer of thermally conductive material; and depositing a third layer of thermally conductive metal on the first layer, the third layer further covering a side wall of the hole and further covering a bottom of the hole provided by the second layer of thermally conductive material on the second surface. The method further comprises filling the hole with a thermally conductive filler. The method still further comprises depositing a fourth layer of thermally conductive metal on the third layer.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
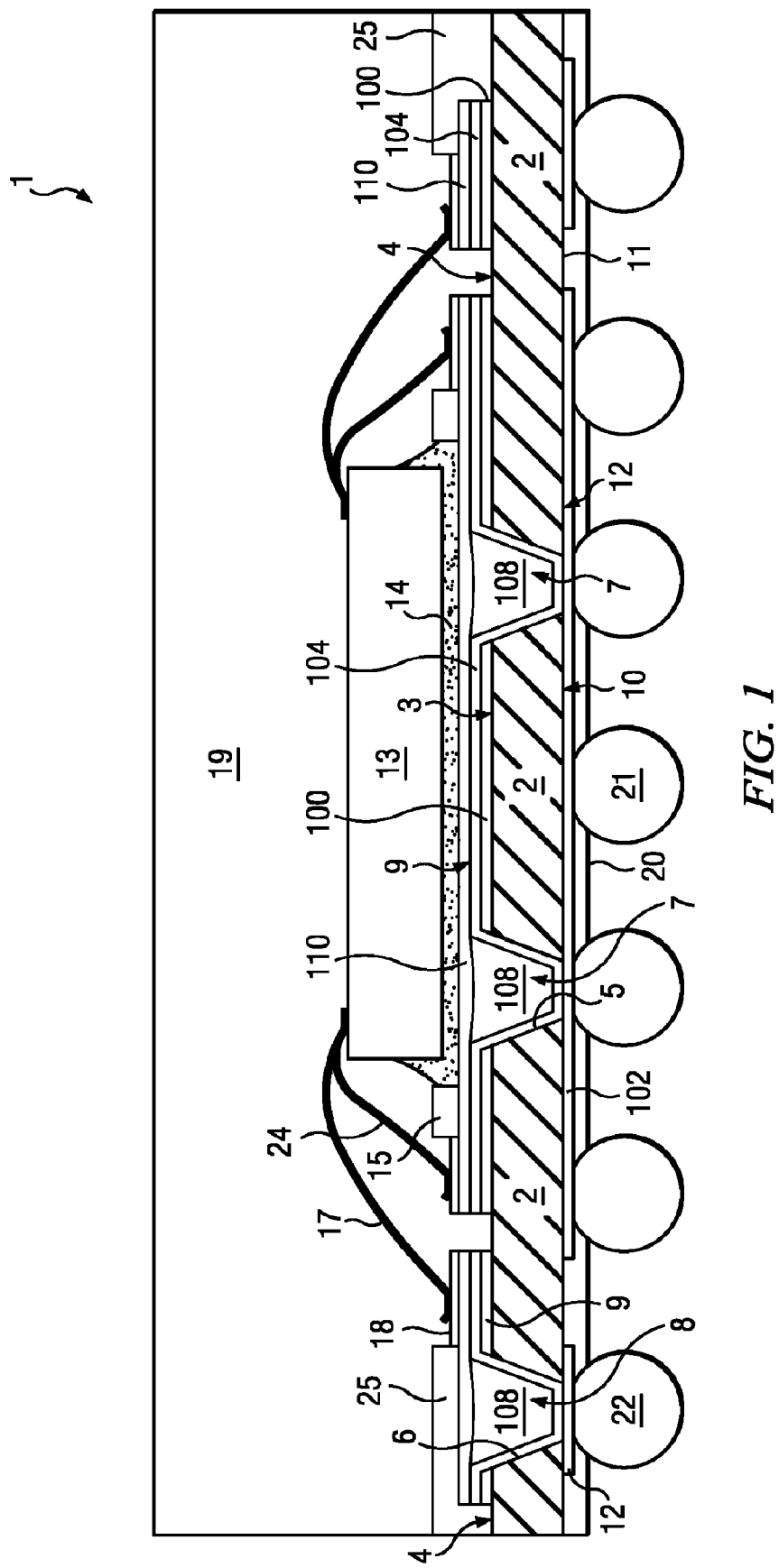
FIG. 1 shows a cross section of a semiconductor package according to the present invention.
Figure 2:
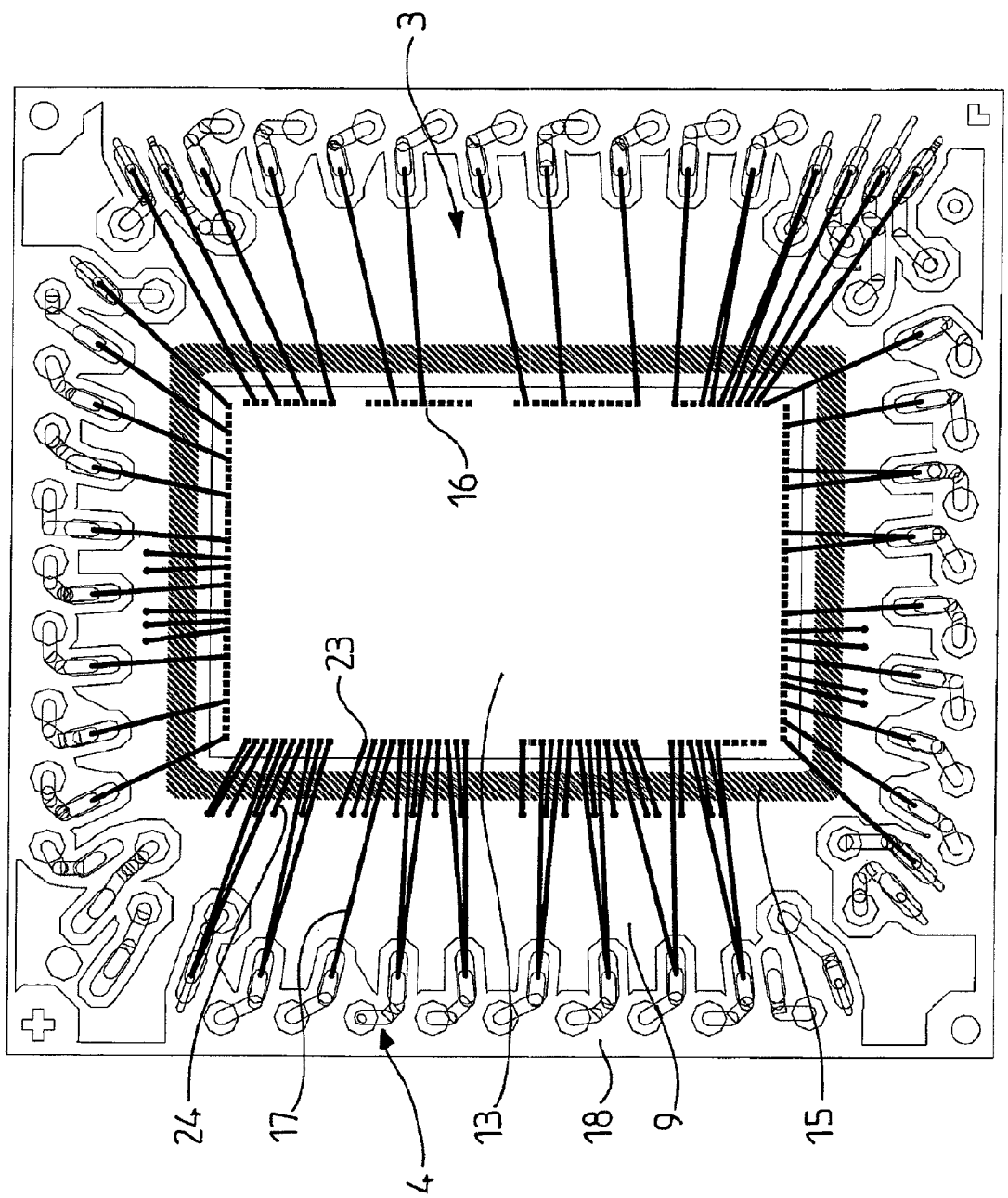
FIG. 2 shows a top view of the semiconductor package of FIG. 1.

The semiconductor package 1 shown in the figures, which is generally of parallelepipedal shape, comprises a support plate 2, which is square or rectangular, made of material that is electrically non-conducting and is a poor thermal conductor, the front face of which has a fixing region 3 surrounded by a connection region 4.

In its fixing region 3, the support plate 2 has a multiplicity of through-passages 5 distributed over the surface, which are completely filled by vias 7 made of at least one material that is thermally conducting and preferably electrically conducting.

In its connection region 4, the support plate 2 has a multiplicity of peripherally distributed through-passages 6, which are completely filled by vias 8 made of at least one electrically conducting and preferably good thermally conducting material.

The front face 4 of the support plate 2 is covered in its fixing region 3 by at least one front layer 9 made of a thermally conducting and preferably electrically conducting material.

A region 10 of the rear face 11 of the support plate 2, on the opposite side from the fixing region 9 and substantially corresponding, is also covered with at least one rear layer 12 made of a thermally conducting and preferably electrically conducting material.

Thus, the front layer 9 and the rear layer 12 are thermally coupled by the thermally conducting vias 7.

The rear face of an integrated-circuit chip 13 is fixed to the front face 9 by means of a layer of adhesive 14, the chip 13 being located approximately in the middle of the support plate 2 and the front layer 9 extending beyond the entire periphery of the chip 13.

The layer 9 has, at a certain distance from the periphery of the chip 13, a retaining ring 15 which constitutes a barrier for the layer of adhesive 14.

The front face of the chip 13 is provided with electrical connection pads 16 which are respectively connected by electrical connection wires 17 to localized layers 18 that cover the electrical connection pads 8, these being a certain distance from the layer 9.

The package 1 furthermore includes a parallelepipedal block of insulating encapsulation material, which extends in front of the support plate and encapsulates the chip 13 and the electrical connection wires 17.

A layer 20 of an organic finish material is deposited on the rear of the support plate 2, through which layer thermal connection and preferably electrical connection balls 21, respectively fixed to the rear face of the connection vias 7, and a multiplicity of balls 22 made of an electrically and preferably thermally conducting material, respectively fixed to the rear face of the connection vias 8, pass.

As a result of the foregoing, the heat produced by the chip 13 during its operation can be at least partially captured by the front layer 9 and transmitted to the rear layer 12 by means of vias 7, to be dissipated outside the package 1. The balls 21 may also contribute to this dissipation, directly or via a plate to which they could be connected. The balls 22 may also contribute to this dissipation.

Moreover, in the example shown, the front face of the chip 13 has electrical connection pads 23 that are connected by electrical connection wires 24 to the front layer 9, on that part of the latter which is external to the retaining ring 15, these wires 24 also being encapsulated in the block of encapsulation 19.

Thus, the pads 23 on the chip 13, which may be bulk pads, are electrically connected to the balls 21 for the purpose of external electrical connection.

The semiconductor package 1 can be fabricated in the following manner.

Starting with a support plate 2, a front layer 100 and a rear layer 102, for example made of front copper, are deposited on its opposed faces provided by a front face with fixing region 3 and connection region 4 and rear face 11.

The holes 5 and 6 are drilled, for example by etching or by a laser, through the front copper layer 100 deposited beforehand and into the support plate 2 until reaching (terminating at) the rear copper layer 102.

Deposited on the front face is a copper layer 104 that covers the non-drilled parts of the previous layer 102 and covers the walls of the holes 5 and 6 and the bottom of these holes on the rear layer 102 deposited beforehand.

The holes 5 and 6 are filled 108 from the front with copper or with another thermally and electrically conducting material.

The entire front face is again covered with a leveling copper layer 110.

The rear finish layer 20 made of an organic material is deposited.

In a variant, a front finish layer 25 made of an organic material is deposited.

The front layers 100, 104, 110 and 18 are then cut between the fixing region 3 and the connection region 4.

Thus, the vias 7 and 8 of the layers 9 and 12 described above are obtained.

The stop ring 15 is produced.

The chip 13 is then fixed by means of the layer of adhesive 14, the flow of which before it cures is stopped by the projecting retaining ring 15.

The electrical connection wires 17 and 24 are then attached.

The encapsulation block 19 is produced in an injection mold.

The balls 21 and 22 are then mounted.

As is now standard practice, several packages may be fabricated on a single support plate and in a single encapsulation block, and then each individual package 1 can be obtained by sawing.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method, comprising:
   depositing a first layer of thermally conductive metal on a first surface of a support plate made of an electrically non-conducting material;
   depositing a second layer of thermally conductive metal on a second surface of the support plate opposite the first surface;
   forming at least one hole in the first layer of thermally conductive metal, the hole extending through support plate and terminating at the second layer of thermally conductive metal; and
   depositing a third layer of thermally conductive metal on the first layer, the third layer further covering a side wall of the hole and further covering a bottom of the hole provided by the second layer of thermally conductive metal on the second surface and leaving an opening at the location of the hole.

2. The method of claim 1 further comprising filling the opening with a thermally conductive filler.

3. The method of claim 2 further comprising depositing a fourth layer of thermally conductive metal on the third layer and on the thermally conductive filler, the fourth layer having a level top surface across the third layer and thermally conductive filler.

4. The method of claim 3 further comprising depositing a front finish layer of an organic material on the fourth layer of thermally conductive metal.

5. The method of claim 4 further comprising depositing a rear finish layer of an organic material on the second layer of thermally conductive metal.

6. The method of claim 3 further comprising removing the first, third and fourth layers down to the first surface of the support place to form an encircling region defining an inner fixing region for receiving an integrated circuit chip and an outer connection region for making electric connection to the integrated circuit chip.

7. The method of claim 6 further comprising attaching the integrated circuit chip to the inner fixing region.

8. The method of claim 7 further comprising connecting bonding wires between the integrated circuit chip and the inner fixing region.

9. The method of claim 7 further comprising connecting bonding wires between the integrated circuit chip and the outer connection region.

10. A method comprising:
    forming a first thermally conducting layer on a top surface of an insulating chip support;
    forming a second thermally conducting layer on a bottom surface of the insulating chip support;
    wherein forming the first thermally conducting layer comprises:
       forming a first thermal layer on the top surface;
       forming holes at locations for thermally conducting vias, the holes passing through the first thermal layer and passing into the insulating chip support to a depth which exposes a surface of the second thermally conducting layer at a bottom of each hole; and forming a second thermal layer over the first thermal layer and lining walls of the holes and the exposed surface of the second thermally conducting layer at the bottom and leaving an opening at the location of each hole.

11. The method of claim 10 further including depositing a conductive fill material in the openings so as to form, with the second thermal layer lining the walls and exposed surface of the second thermally conducting layer at the bottom of the holes, the thermally conducting vias.

12. The method of claim 11 further comprising forming a third layer over the second thermal layer and conductive fill material in the holes, the third layer having a level top surface across the second thermal layer and conductive fill material in the openings.

13. The method of claim 10 further including forming an overlying front finish layer made of organic material above the first thermally conducting layer.

14. The method of claim 10 further including forming an overlying rear finish layer made of an organic material on the second thermally conducting layer.

15. The method of claim 10 further including attaching an integrated circuit chip above the first thermally conducting layer.

16. The method of claim 15 further including dissipating heat generated by the attached integrated circuit chip through the thermally conducting via and out from the second thermally conducting layer.

17. The method of claim 16 wherein dissipating comprises passing the heat through thermally conducting balls attached to the second thermally conducting layer.

* * * * *